(12) United States Patent  
Ho et al.

(10) Patent No.: US 6,285,620 B1  
(45) Date of Patent: Sep. 4, 2001

(54) SEMICONDUCTOR DEVICE AND METHOD FOR REPAIRING FAILED MEMORY CELL BY DIRECTLY PROGRAMMING FUSE MEMORY CELL

(75) Inventors: Ming-Jing Ho; Le-Tien Jung, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/665,788

(22) Filed: Sep. 20, 2000

Related U.S. Application Data

(62) Division of application No. 09/473,083, filed on Dec. 28, 1999.

(51) Int. Cl.[7] ................................................ G11C 7/00
(52) U.S. Cl. ......................................... 365/225.7; 365/200
(58) Field of Search ............................. 365/200, 225.7, 365/189.01

(56) References Cited

U.S. PATENT DOCUMENTS

| | | | |
|---|---|---|---|
| 5,404,049 | * 4/1995 | Canada et al. | 327/525 |
| 5,841,708 | * 11/1998 | Nagata | 365/200 |
| 5,978,248 | * 11/1999 | Marr et al. | 365/96 |
| 6,091,649 | * 7/2000 | Choi | 365/200 |

\* cited by examiner

*Primary Examiner*—Hoai V. Ho  
(74) *Attorney, Agent, or Firm*—Charles C. H. Wu; Charles C. H. Wu & Associates

(57) ABSTRACT

A semiconductor memory device and a method for mending a failed memory cell by directly programming a fuse memory cell. Using a tester to program the fuse memory cell directly, a laser machine is not required. In addition, to move the wafer for fuse allocation is not required either, so that the consumption in time and cost can be greatly reduced. Even after the package is complete, the repairing work can still be performed. In addition, whether the voltage source is connected or disconnected, the failed address information is kept and stored without being lost. A self-repair for self-test can thus be applied.

5 Claims, 3 Drawing Sheets

SEMICONDUCTOR DEVICE AND METHOD FOR REPAIRING FAILED MEMORY CELL BY DIRECTLY PROGRAMMING FUSE MEMORY CELL

The Divisional of Copending application Ser. No. 09/473,083 filed Dec. 28, 1999

BACKGROUND OF THE INVENTION

1. Field of the Invention

The invention relates in general to an apparatus and a method for repairing a failed memory cell. More particularly, the invention relates to a semiconductor and a method for repairing a failed memory cell that directly program a fuse memory cell by a tester. Therefore, after the completion of package, the failed address can still be repair by using a high voltage circuit without being restricted by the package.

2. Description of the Related Art

For the fabrication process of a semiconductor memory device, to obtain a high yield is always important. In case that there exist significant failed memory cells in a semiconductor memory device, or even that there exists only one failed memory cell, the semiconductor memory device is undeserving as a product. While fabricating a semiconductor memory device, a device with a higher integration tends to contain more failed memory cells. Or the semiconductor memory device tends to have a higher possibility to contain failed memory cells. That is, as the integration of a semiconductor device increases, the yield is reduced.

As the technique for fabricating a semiconductor memory device becomes more and more complex, the technique for packaging is correspondingly more difficult. For example, the particles or scraps produced and remained during fabrication may inevitably cause a reduction in yield. To enhance the yield, the prior technique has developed a redundancy circuit to obtain a desired yield of semiconductor memory devices. In addition to the main memory cell array for saving binary data, a redudant memory cell array is provided to replace the failed memory cells in columns and rows of the main memory cell array. Each individual redundant memory cell is connected to individual word line and bit line. Assuming that there are thousands of failed memory cells found in the main memory cell array, these redundant memory cells can replace these failed memory cells to provide a pass or non-failure memory chip.

Using the redundant memory cells or backup memory cells to replace the failed memory cells is advantageous in enhancing the yield of memory device. However, once the amounts of the designed redundant memory cells is insufficient, that is, if the number of the failed memory cells exceeds the amount of the redundant memory cells, the device cannot be repaired to be used any more.

As mentioned above, redundant memory cells can be designed around a main memory cell array to replace the failed memory cells, so as to obtain a non-defect memory chip. The connection between the main memory cell array and the redundant memory cell is typically achieved by fuse. The fuse can be blown using a laser light beam or a current. While a failed memory cell is to be repaired, the fuse is open electrically or using laser. The fuse is remained close while no repairing work is performed.

In addition, in the circuit design of a typical semiconductor device, the fuse is used for fine tuning. Especially for a dynamic random access memory (DRAM) design, the fuse is prerequisite. The fuse is often used for redundant row and column repair and is made of polysilicon or metal. A laser is then used to program the address to be repaired.

However, during the process of repair, a laser machine is used, and the wafer is to be move for fuse location. A certain fuse is then blown to proceed the repair of the address. It is thus very time and cost consuming. In addition, after the chip is fabricated, and all the pads have been bonded to the leads of the packages, that is, after being packaged, any failed memory found afterwards can never be repaired further.

SUMMARY OF THE INVENTION

The invention provides a semiconductor memory device to repair failed memory cell via programming a fuse memory cell. The semiconductor memory cell comprises a main memory cell array, a fuse memory cell array, an address programmer, a sense amplifier, a latch and a redundant memory cell array. The main memory cell comprise multiple main memory cells, while the fuse memory cell array comprises multiple fuse memory cells. The address programmer is to receive a voltage source to program an information. A certain fuse memory cell of the fuse memory cell array corresponding to this information is programmed. The sense amplifier is coupled to the fuse memory cell array to sense and receive the repairing information of the fuse memory cell array. The latch is coupled to the sense amplifier to receive and latch up the repairing information from the sense amplifier. The redundant memory cell array comprises multiple redundant memory cells and is coupled to the latch. According to the repairing information of the latch, the redundant memory cell array is to repair the failed memory cells in the main memory cell array.

The invention also provides another semiconductor memory device to repair failed memory cells by programming a fuse memory cell. The semiconductor memory device comprises an address buffer, a main memory cell array, a built-in self testing unit, a data comparator, a fuse memory cell array, an address programmer and a latch. The address buffer is used to receive an address information. The main memory cell array and the fuse memory cell array comprise multiple main memory cells and multiple fuse memory cells, respectively. The main memory cell array is coupled to the address buffer to output the main memory cell address information corresponding to the address information from the address buffer. The built-in self testing unit stores the original address information for all the main memory cells in the main memory cell array. The built-in self testing unit outputs an original address information of the main memory cells corresponding to the address information. The data comparator is coupled to both the main memory cell array and the built-in self testing unit to receive and compare the address information and the original address information of the main memory cells. When the address information is different from the original address information, an error address information is output. The address programmer is coupled to the voltage source, the address buffer and the data comparator. According to the address information and the error address information, a repair address information is output to the fuse memory cell array to program the fuse memory cell corresponding to the repair address information. The latch is coupled to the fuse memory cell array to latch up the repair address information from the fuse memory cell array, and to deliver the repair address information to the main memory cell array. Thus, the failed memory cell in the main memory cell array corresponding to the repair address information is repaired.

The invention thus further provides a method for repairing a failed memory cell using programming a fuse memory cell. A first fuse memory cell and a second memory cell of a word line in the fuse memory array are turned on. A high voltage is applied to breakdown the ONO of the first fuse memory cell. The first fuse memory cell and the second fuse memory cells are then precharged to a logic state. Each time when the voltage source is raised, the first fuse memory cell and the second fuse memory cell are turned on repeatedly and the step of breaking down of the ONO of the first fuse memory cell is repeated. Meanwhile, the output address information of the first and the second fuse memory cells are latched. When the address information of the main memory cell array matches the output address information, the redundant memory cell of the redundant memory cell array corresponding to the output address information is turned on. The failed memory cell of the main memory cell array is thus repaired via the redundant memory cell of the redundant memory array.

Another method to repair a failed memory cell by programming a fuse memory cell is also provided in this invention. According to an address information, the main memory cell array generates a corresponding main memory cell address information. This main memory cell address information is compared to an original address information of the main memory cell array. When the main memory cell address information is different from the original address information, an error address information is generated. According to the address information and the error address information, a repairing address information is generated to repair the corresponding fuse memory cell. The repairing address information is latched, and delivered to the main memory cell array, so as to repair the failed memory cell of the main memory cell array via the fuse memory cell.

The semiconductor device and the method for repairing failed memory cell provided by the invention can be performed by directly programming the fuse memory cell instead of using a laser machine. To move the wafer for aligning the location of fuse is not required either, therefore, the cost and time consumption are greatly reduced. Furthermore, even after the package is complete, the repairing step can also be performed for those failed addresses. In addition, the invention has the function to saving the failed address, even when the power source is off and turned on again. The failed address is still stored to be used for self-repairing during a self-test.

Both the foregoing general description and the following detailed description are exemplary and explanatory only and are not restrictive of the invention, as claimed.

DESCRIPTION OF THE PREFERRED EMBODIMENTS

Figure 1:
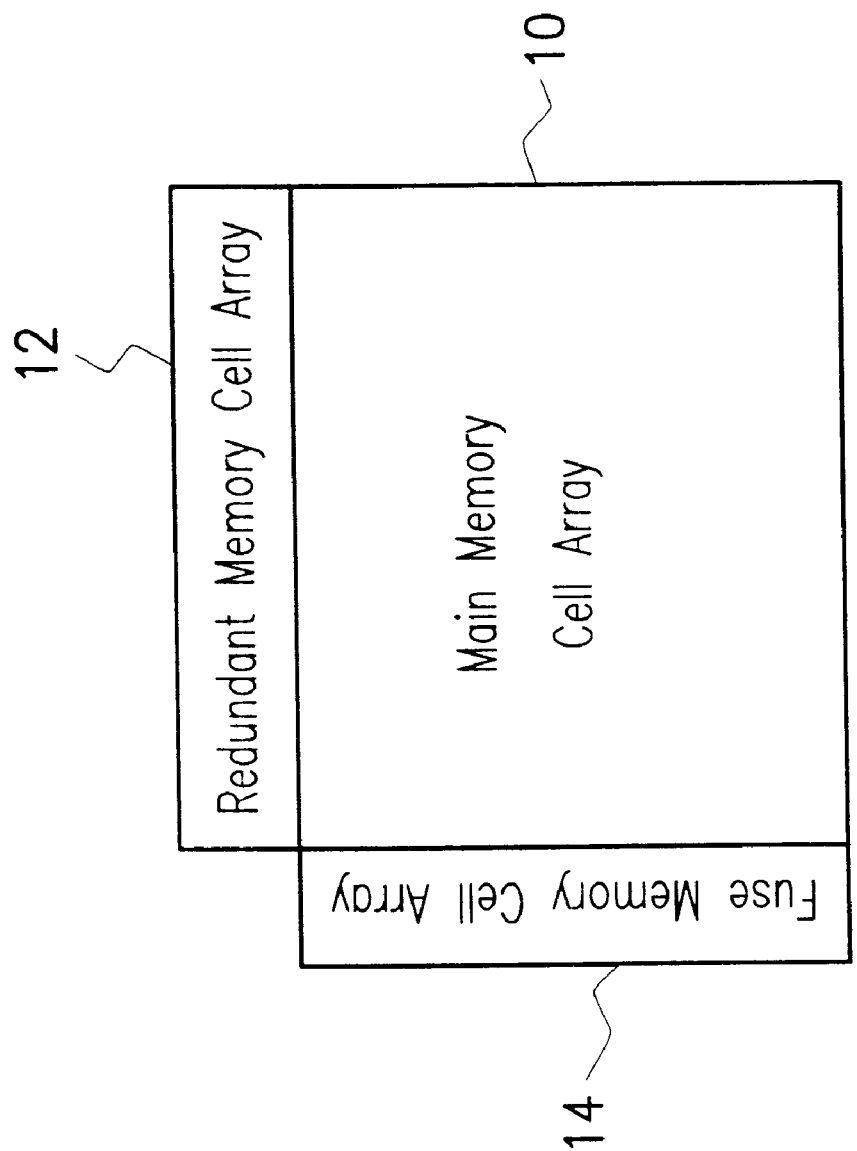
FIG. 1 is a schematic drawing for the structure of various memory cell arrays.

It is a known technique that a redundant memory cell array is formed around a main memory cell array for repairing any failed memory cells exist in the main memory cell array. It is appreciated that in addition to the redundant memory cell around the main memory cell array, a fuse memory cell array is also formed in the main memory cell array to assist the failed memory repairing work. The structure is shown as FIG. 1 and comprises a main memory cell array 10, a redundant memory cell array 12 and a fuse memory cell array 14. A detailed description of these memory cell arrays is as follows.

In addition, the invention utilizes the breakdown properties of an ONO (oxide/nitride/oxide) dielectric layer in a capacitor of the memory cell. That is, when the ONO is broken down, the memory cell is in a failed state no matter a "0" is written therein or a "1" is written therein. A high voltage circuit is then used to program the DRAM cell, and the information of the memory cell is read via the circuit, the memory cell can thus be used as a fuse.

Figure 2:
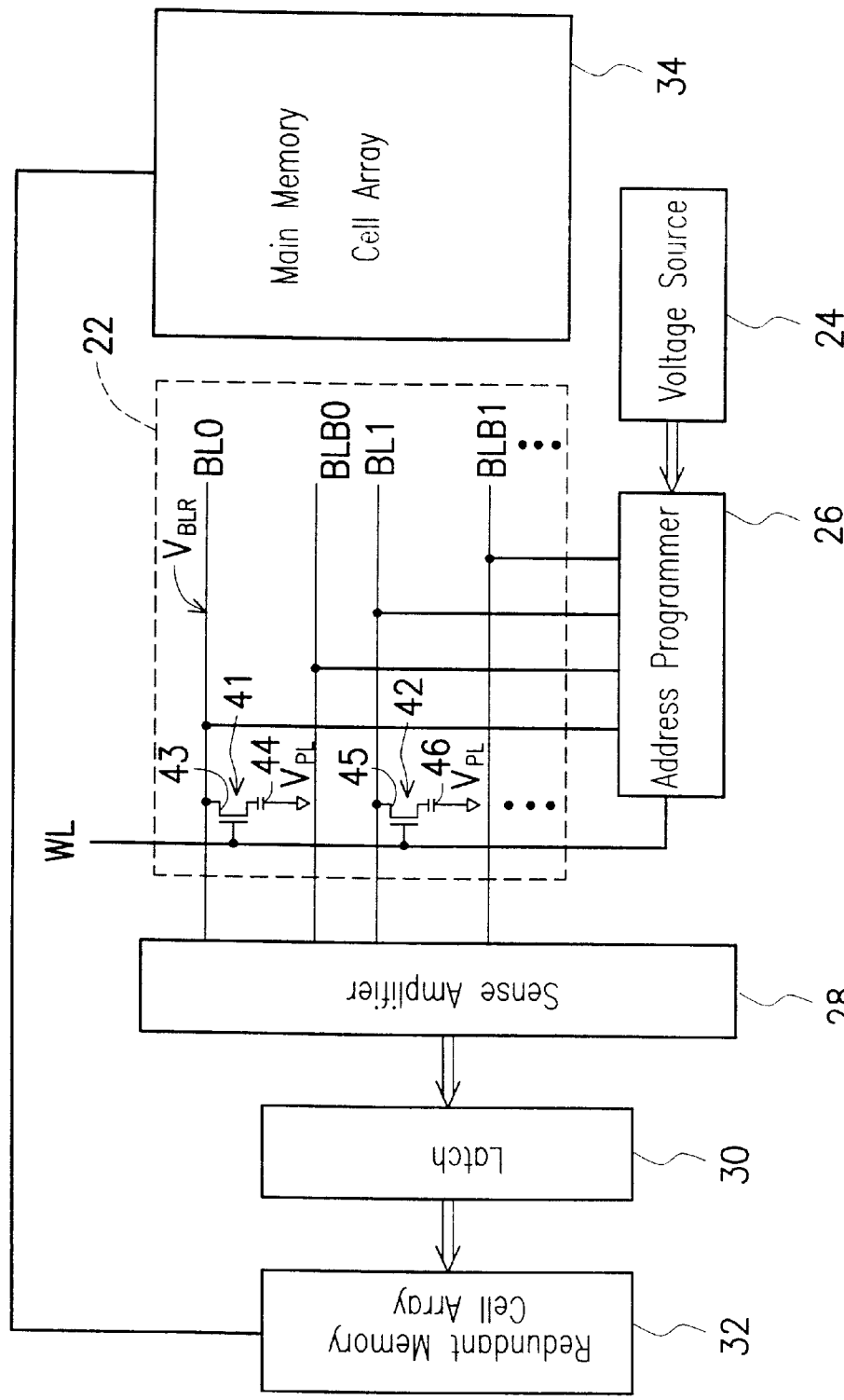
FIG. 2 shows a block diagram of a semiconductor device for repairing failed memory cells by programming the fuse memory cell.

FIG. 2 shows an embodiment of the invention in which a block diagram of a semiconductor device for repairing failed memory cell by programming fuse memory cells is illustrated.

The semiconductor device 20 for repairing failed memory cells by programming fuse memory cells comprise a fuse memory cell array 22, a voltage source 24 (a power supply), an address programmer 26, a sense amplifier 28, a latch 30, a redundant memory cell array 32 and a main memory cell array 34. The fuse memory cell array 22 comprises multiple fuse memory cells, each of which comprises an NMOS transistor and a capacitor. For example, the fuse memory cell 41 comprises an NMOS transistor 43 and a capacitor 44, while the fuse memory cell 42 comprises an NMOS transistor 45 and a capacitor 46. The structure of these fuse memory cells is similar to those of the main memory cell array 34.

The voltage source provides a high voltage to the address programmer 26, so as to program a destined fuse memory cell of the fuse memory cell array 22 by the address programmer 26. The sense amplifier 28 is coupled to the fuse memory cell array 22 to sense and receive a data information from the fuse memory cell array 22. The data information is then latched by the latch 30. The latch 30 outputs the data information to the redundant memory cell array 32 to repair the failed memory cell in the main memory cell array 34 according to the redundant memory cell of the destined address in the redundant memory cell array 32.

An operation of this embodiment comprises:

Step 1: the word line WL is connected to a high voltage, for example, 8V, so that all the NMOS transistors, for example, NMOS transistors 43 and 45 of the fuse memory cells 41 and 42 are turned on. Meanwhile, if the ONO of the fuse memory cell 41 breaks down, the potential level of the bit line BLB0 is pulled up to High, such as to a potential level of 7V.

Step 2: If $V_{PL} > V_{BLR}$, all the fuse memory cells 41 and 42 are precharged to "0". Since the ONO of the fuse memory cell 41 breaks down, so that the state of the reading is "1", and the fuse memory cell 42 is "0". If $V_{PL} < V_{BLR}$, the fuse memory cells 41 and 42 are precharged to "1", the reading to the fuse memory cell 41 is "0", while the fuse memory cell 42 is "1".

Step 3: Each time when the voltage source of the semiconductor device is powered up, each word line WL of the fuse memory cells 41 and 42 is experienced with step 2 once, and the reading address information is saved in the latch 30 via the sense amplifier 28.

Step 4: When the address information input to the main memory cell array 34 matches the address information of the latch 30, the redundant row or column of the redundant memory array 32 is turned on to repair the corresponding failed memory cells of the main memory cell array 34.

As a conclusion, by directly programming the fuse memory cell with a tester, neither a laser machine nor a shift of the wafer for fuse allocation is required. Thus, the cost and time consumption are greatly reduced.

In addition, when all the pads are bonded to the package leads, even the package is complete, this method and device can also be utilized for repairing failed address.

Recently, built-in self test and built-in self-repair have been developed for repairing failed memory cells. However, not a method is provided to store the failed address information. Using the method and device provided by the invention, not only the failed address can be repaired, the address information can be save even when the voltage is turned off and turned on again.

Figure 3:
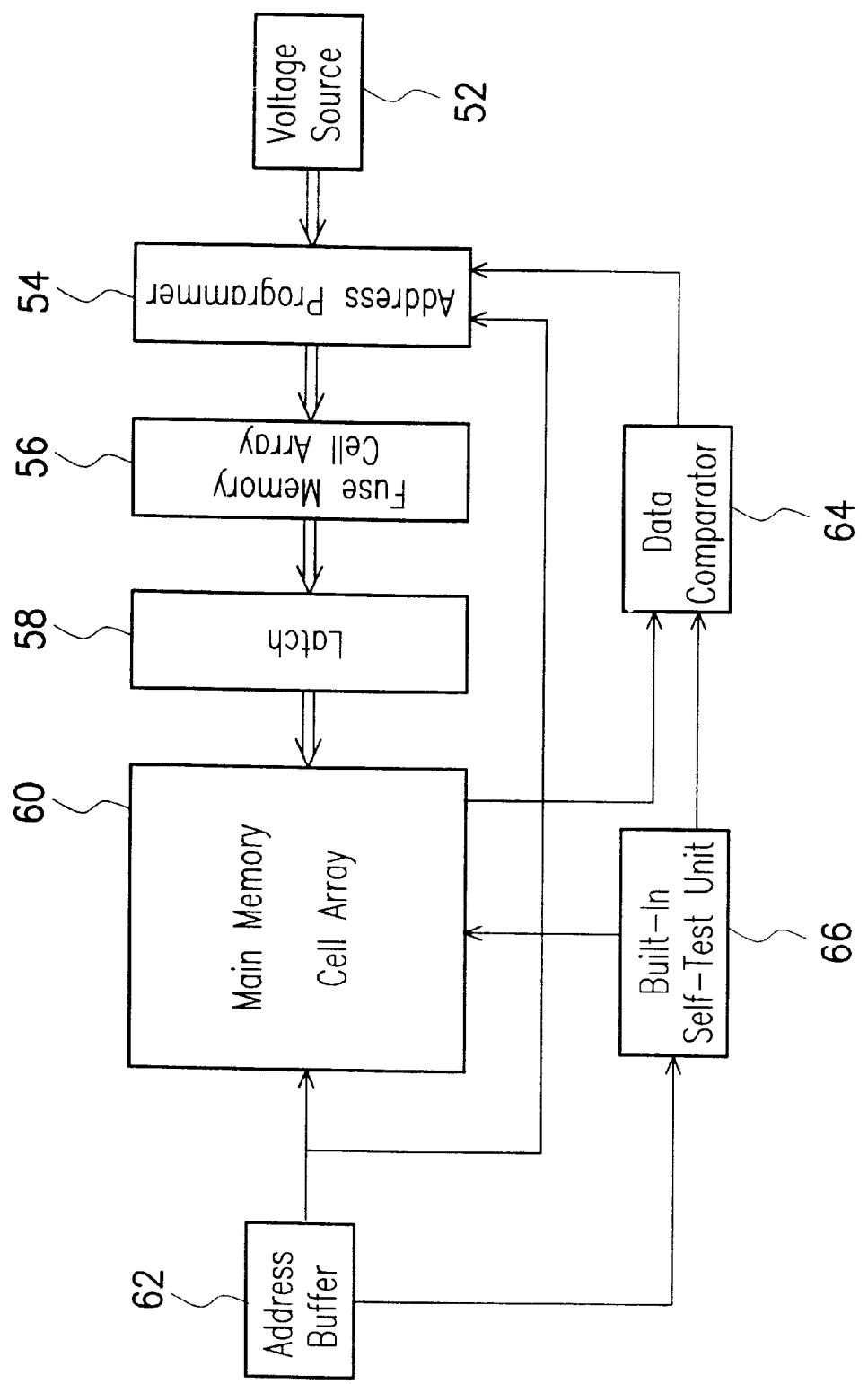
FIG. 3 shows another block diagram of a semiconductor device for repairing failed memory cells by programming the fuse memory cell.

FIG. 3 shows another embodiment of the invention in which a semiconductor device repairing failed memory cells by programming a fuse memory cell is illustrated. The semiconductor memory cell 50 comprises a voltage source 52 (a power supply), an address programmer 54, a fuse memory cell array 56, a latch 58, a main memory cell array 60, an address buffer 62, a data comparator 64 and a built-in self-test unit 66. Each of the fuse memory cells of the fuse memory cell array comprises an NMOS transistor and a capacitor. The structure of the fuse memory cells is similar to that of the main memory cells in the main memory cell array 60.

The voltage source 52 provides a high voltage to the address programmer 54 to program a destined fuse memory cell of the fuse memory cell array 56 by the address programmer 54. According to an address information and an error address information from the address buffer 62 and the data comparator 64, the address programmer 54 outputs a repair address information to the fuse memory cell array 56, so as to program the fuse memory cell corresponding to the repair address information. The latch 58 latches the repair address information from the fuse memory cell array 56 and sends the repair address information to the main memory cell array 60, so as to repair the failed memory cells of the main memory cell array 60. The address buffer 62 is to receive the address information which is then sent to the address programmer 54, the main memory cell array 60 and the built-in self-test unit 66. The main memory cell array 60 outputs the main memory cell address information to the data comparator 64 according to the address information of the address buffer 62. The built-in self-test unit 66 stores the original address information for all the main memory cells of the main memory cell array 60, and outputs a original address information corresponding to the address information of the address buffer 62 to the data comparator 64. The data comparator 64 receives and compares the main memory cell address information and the original address information. When the main memory cell address information is not identical to the original address information, an error address information is output to the address programmer 54.

An operation method of this embodiment comprises:

Step 1: When the main memory cell array 60 receives the address information of the address buffer 62, the main memory cell array 60 outputs a main memory cell address information corresponding to the address information from the address buffer 62 to the data comparator 64.

Step 2: When the data comparator 64 receives the main memory cell address information of the main memory cell array 60 and the original address information from the built-in self-test unit 66, the main memory cell address information is compared to the original address information. When these two information are identical, no information is output. On the contrary, when these two information are different from each other, the data comparator 64 outputs an error address information to the address programmer 54. For example, when the main memory cell address information is in a logic state "0" and the original address information is in a logic state "1", it indicates that the main memory cell corresponding to the main memory cell address information is a failed memory cell. Meanwhile, the data comparator 64 outputs an error address information corresponding to the failed memory cell to the address programmer 54. In contrast, when both the logic states of the main memory cell address information and the original address information are "0", it indicates that the corresponding main memory cell is a normal memory cell, so that no information is output from the data comparator 64.

Step 3: The address programmer 54 outputs a repair address information to the fuse memory cell array according to the address buffer 62 and the data comparator 64, so as to program the fuse memory corresponding to the repair address information.

Step 4: The latch 58 latches the repair address information of the fuse memory cell array 56. The repair address information is sent to the main memory cell array 60 to repair the corresponding failed memory cell.

According to the repair method of the embodiment, since failed address information is stored or latched in the latch 58, no matter whether the voltage is vanished or not, the information is still kept to save a lot of repairing time.

The invention thus comprises at least the following advantages:

(1) By directly programming the fuse memory cell by a tester, a laser machine or a shift of the wafer for fuse allocation is not required to save the cost and time consumption.

(2) Even after the package is complete, the failed address can still be found and repaired.

(3) Can be used for self-repair for self-test.

(4) Even when the voltage source is vanished, the failed address information can be kept still.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A semiconductor device to repair failed memory cells by programming fuse memory cells, comprising:

an address buffer, to receive an address information;

a main memory array, comprising a plurality of main memory cells and coupled to the address buffer, so as to output a main memory cell address corresponding to the address information;

a built-in self-test unit, storing an original address information of the main memory cells in the main memory cell array, and to output the original address information of the main memory cell corresponding to the address information;

a data comparator, coupled to the main memory cell array and the built-in self-test unit to receive and compare the main memory cell address information and the original address information, and outputting an error address information when the main memory cell address information is not identical to the original address information;

a fuse memory cell array, comprising a plurality of fuse memory cell array;

an address programmer, to receive a voltage source and coupled to the address buffer and the data comparator, outputting a repair address information to the fuse memory cell array according to the address information and the error address information, so as to program the fuse memory cell corresponding to the repair address information; and a latch, coupled to the fuse memory cell array to latch the repair address information from the fuse memory cell array, and to output the repair address information to the main memory cell array to repair a corresponding failed memory cell in the main memory cell array.

2. The semiconductor device according to claim 1, wherein each of the fuse memory cells has a structure similar to the main memory cells, the structure comprises an NMOS transistor and a capacitor.

3. The semiconductor device according to claim 1, wherein the voltage source is provided by a power supply.

4. The semiconductor according to claim 1, comprising further a dynamic random access memory device.

5. A method for repairing a failed memory cell by programming a fuse memory cell, comprising:

generating a main memory cell address information according to an address information by a main memory cell array;

comparing the main memory cell address information to an original address information of the main memory cell array;

generating an error address information when the main memory cell address information is not identical to the original address information;

generating a repair address information according to the address information and the error address information, so as to program a fuse memory cell corresponding to the repair address information; and latching the repair address information and sending the repair address information to the main memory cell array, so as to repair the failed memory cell of the main memory cell array via the fuse memory cell.

* * * * *